United States Patent [19]

Kirby

[11] 4,387,467
[45] Jun. 7, 1983

[54] SATELLITE TEST CHAMBER WITH ELECTROMAGNETIC REFLECTION AND RESONANCE DAMPING FOR SIMULATING SYSTEM GENERATED ELECTROMAGNETIC PULSES

[75] Inventor: William G. Kirby, Tullohoma, Tenn.

[73] Assignee: The United States of America as represented by the Secretary of the Air Force, Washington, D.C.

[21] Appl. No.: 286,817

[22] Filed: Jul. 27, 1981

[51] Int. Cl.³ .................. A61K 27/02; A61N 5/00; C08J 1/02; G21G 5/00
[52] U.S. Cl. ........................... 378/68; 333/228; 343/18 A; 343/703
[58] Field of Search .............. 378/68; 343/703, 18 A, 343/18 R; 333/228

[56] References Cited

U.S. PATENT DOCUMENTS 2,599,944 6/1952 Salisbury ..................... 343/18 R
2,639,327 5/1953 Heller .......................... 333/228
2,866,905 12/1958 Yeomans ....................... 378/68

Primary Examiner—Alfred E. Smith
Assistant Examiner—T. N. Grigsby
Attorney, Agent, or Firm—Donald J. Singer; Willard R. Matthews

[57] ABSTRACT

The simulation of systems generated electromagnetic pulses in a space environment for satellite testing is accomplished by means of a spherical test chamber that is coupled with a pulsed x-ray source. Resonance damping is provided by a spherical resistive resonance suppression grid that is placed within the test chamber and spaced from its inner surface by a distance that effects optimum damping of electromagnetic wave energy at the fundamental chamber standing wave frequency. Electrons generated from surfaces within the chamber are suppressed by a spherical resistive electron backscatter suppression grid disposed between the resonance suppression grid and the chamber inner wall and by coating the inner chamber wall with electron emission suppression material.

6 Claims, 4 Drawing Figures

SATELLITE TEST CHAMBER WITH ELECTROMAGNETIC REFLECTION AND RESONANCE DAMPING FOR SIMULATING SYSTEM GENERATED ELECTROMAGNETIC PULSES

STATEMENT OF GOVERNMENT INTEREST

The invention described herein may be manufactured and used by or for the Government for governmental purposes without the payment of any royalty thereon.

BACKGROUND OF THE INVENTION

This invention relates to a facility for the study of the physical phenomena which occurs on a satellite as a result of the X-ray pulse from an exoatmosphere nuclear detonation and more particularly to the means by which the facility interactions with the test satellite are suppressed to simulate satellite conditions in free space.

As a result of an Air Force sponsored analytical study it has been determined that an exoatmosphereic nuclear detonation could be a threat to the survival of strategic communications, command and control satellites. When the X-rays from such an exoatmospheric nuclear blast interacts with a spacecraft large current pulses can be produced. The physical phenomenon that occurs on a satellite or other spacecraft as a result of the X-ray pulse from the detonation is referred to as the system generated electromagnetic pulse.

It is therefore of much importance that this phenomenon be studied in order that means may be derived to overcome the adverse effects caused by it. Simulation of these conditions are commonly made by the use of a test chamber and a high power pulsed X-ray source within which a satellite to be tested is placed. There is, however, a concern with the quality of simulation that is obtained within the test chamber. Two satellite/chamber interactions that are initiated by the X-ray pulse and that can degrade the quality of simulation are: (1) the electromagnetic resonance and reflections in the chamber; and (2) the generation of electrons from internal surfaces of the chamber.

Previous work has shown that a solid resistive sheet spaced a distance off the chamber wall will effectively minimize the resonance problem. However, this increase in internal surface area intensifies the second simulation problem of electron generation.

Accordingly there currently exists the need for damping means for use in satellite test facilities of the type that does not increase the generation of electrons from the interior surface of the test chamber. There is also the need for improved suppression of such electrons in these devices. The present invention is directed toward satisfying these needs.

SUMMARY OF THE INVENTION

The invention is a satellite test facility with electromagnetic reflector and resonance damping means for simulating system generated electromagnetic pulses in a space environment. It comprises a spherical steel test chamber with means for mounting a test satellite at its center. A pulsed X-ray source is integrated into the closed test system and is oriented to direct high power X-ray pulses to the test satellite. A vacuum system pumps the test facility to provide a space atmosphere. A spherical resistive resonance suppression grid positioned within and spaced from the inner surface of the test chamber provides electromagnetic resonance suppression, and a spherical resistive electron backscatter suppression grid is positioned between the resonance suppression grid and the test chamber wall to suppress electrons. Electron suppression is further enhanced by a coating of electron emission suppression material disposed on the inner test chamber wall. The resistance resonance suppression grid is spaced at a radius from the center of the test chamber that provides optimum damping for the fundamental chamber standing wave frequency.

It is a principal object of the invention to provide a new and improved test chamber for simulating system generated electromagnetic pulses in a satellite. It is another object of the invention to provide a test chamber for simulating system generated electromagnetic pulses in satellites having electromagnetic reflection and resonance damping means.

It is another object of the invention to provide a test chamber for simulating system generated electromagnetic pulses in satellites having resonance damping means that does not increase the generation of electrons from the internal surfaces of the test chamber.

It is another object of the invention to provide a test chamber for simulating system generated electromagnetic pulses in satellites having improved means for the suppression of electrons generated within the test chamber.

These together with other object, features and advantages of the invention will become more readily apparent from the following detailed description taken in conjunction with the illustrative embodiment in the accompanying drawings.

DETAILED DESCRIPTION OF THE PREFERRED EMBODIMENT

The satellite test facility of the invention comprehends an exaluated containment test vessel having means for holding a satellite to be tested and incorporating a pulsed X-ray source and also including electromagnetic reflection and resonance damping means.

Figure 1:
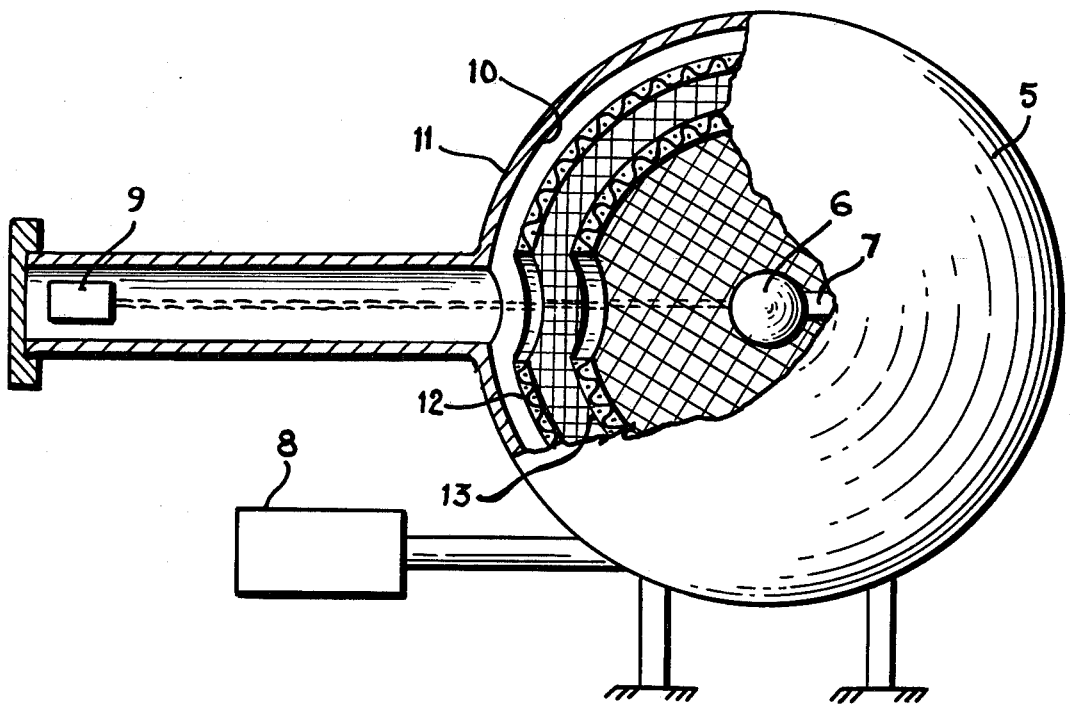
FIG. 1 is a partially cut away front view of the satellite test chamber of the invention.

FIG. 1 illustrates one presently preferred embodiment of the invention. Referring thereto the structure shown comprises test chamber 5 (partially cut away to better illustrate interior components), satellite 6 (under test), satellite holding means 7, vacuum pumping system 8, pulsed X-ray source 9, spherical resistive resonance suppression grid 13 and spherical resistance electron backscatter suppression grid 12. The interior surface of chamber wall 11 is coated with electron emission suppression material 10. This can be, for instance a 0.004 inch thick layer of Glyptol 1202. The suppression grids 12 and 13 are mounted on dielectric standoffs (not shown) that are u⁻iformly spaced over the interior wall of chamber 5.

Figure 2:
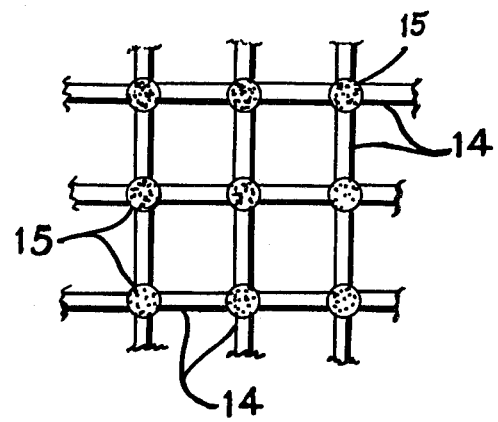
FIG. 2 is a detail of a portion of the resistive suppression grid of the invention.

FIG. 2 is a detail showing a typical portion of suppression grid structure. The grids are spherical in shape and concentric with each other and with the chamber as shown. The grid wires 14 are cemented to one another with electrically conductive cement to form a three quarter inch grid. It has been found that means suitable for this application can be fabricated from fiberglass string impregnated with carbon having a resistance of 3600 ohms per foot thus providing a grid with an impedance of approximately 200 ohms per square. The grids can also be fabricated with commercially available components using conductive Varcore for the wires and Electrodag 501 for the conductive cement. The amount of cement should be minimized to prevent any changes in the grid impedance. The three quarter inch grid spacing is a compromise between a small spacing for high frequency damping and the necessity to minimize the area of the internal surfaces that could emit electrons when struck by X-rays. This grid spacing provides good damping up to 300 Mhz and also provides required optical transmission of approximately 80%. The damping falls off beyond 300 Mhz. This spacing, however, is adequate since it has been shown that the high frequency nodes damp out very easily. The electron backscatter suppression grid 12 is located 0.13 radii off the chamber wall and resonance suppression grid 12 is located 0.20 radii off the chamber wall.

Figure 3:
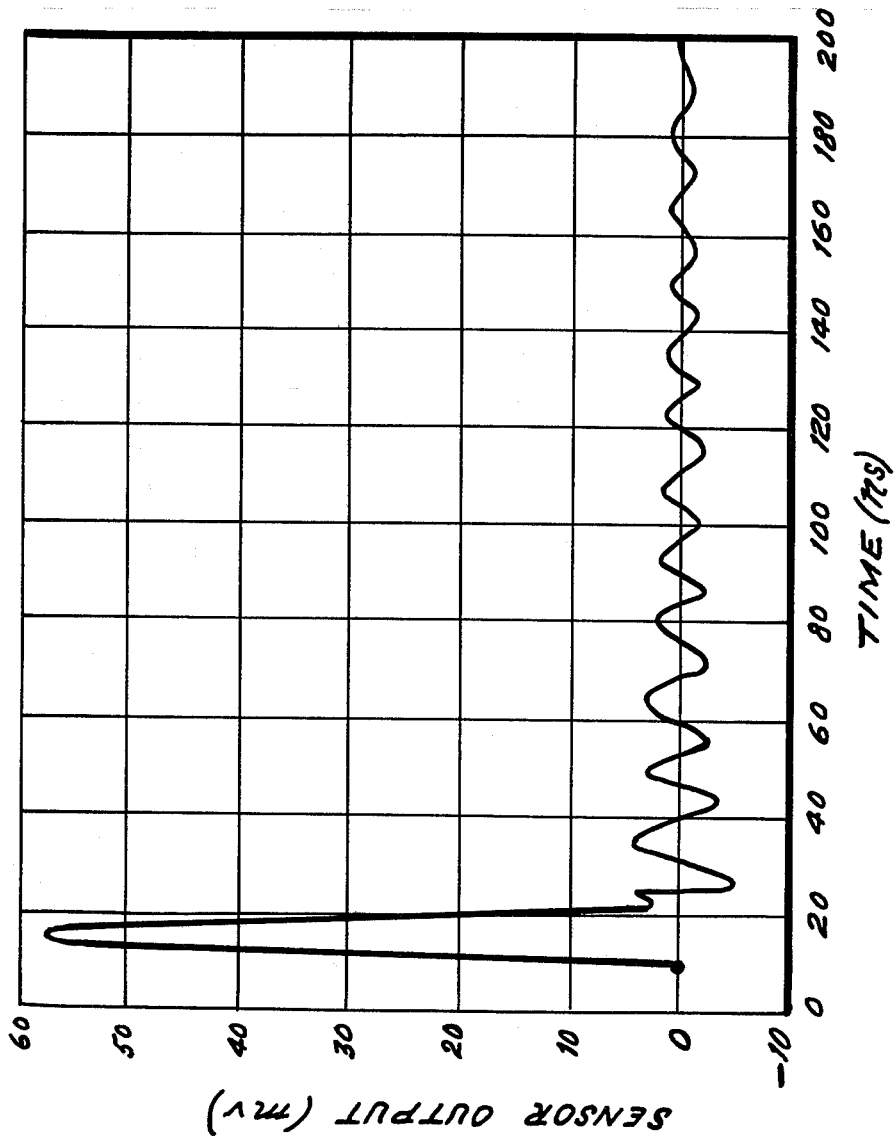
FIG. 3 is a graph showing test facility sensor output without damping.
Figure 4:
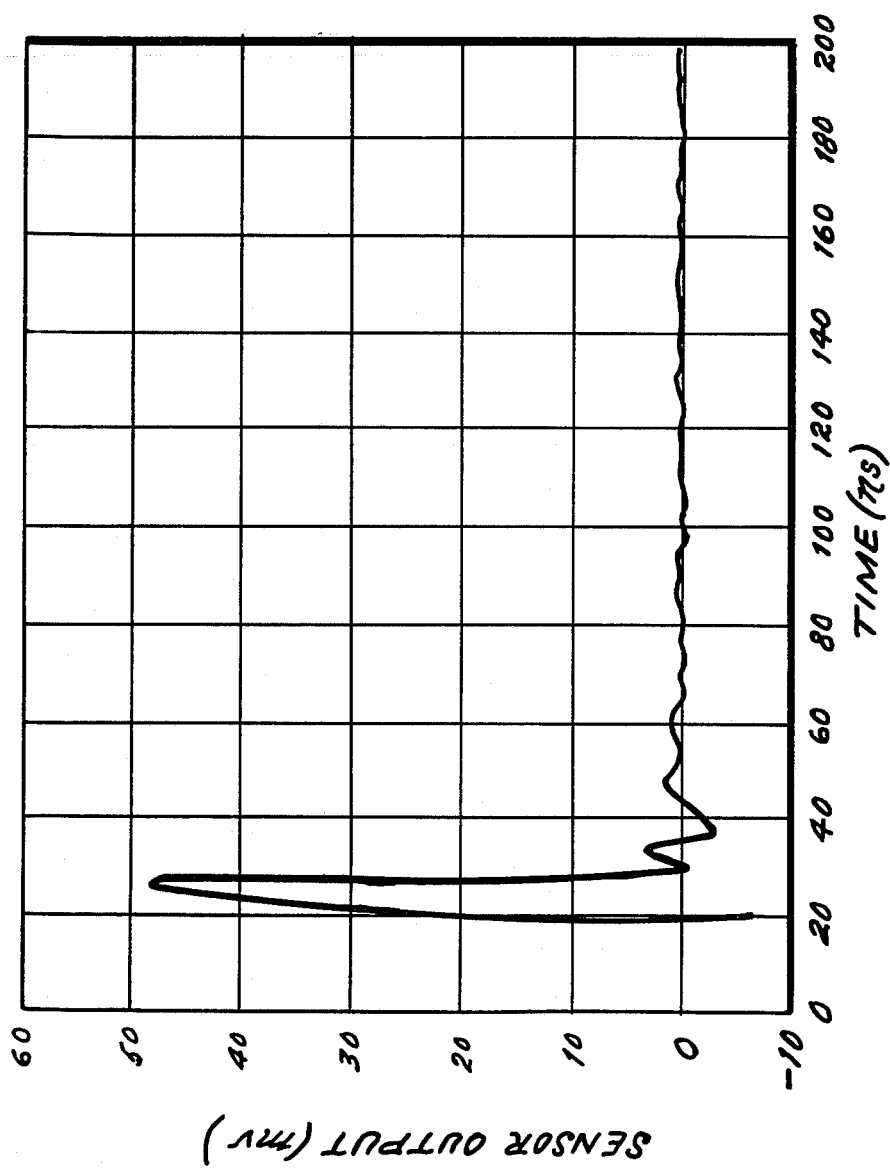
FIG. 4 is a graph showing test facility sensor output with damping in accordance with the principles of the invention.

The effectiveness of the resonance suppression provided by the invention is seen by comparing the graph of FIG. 3 which shows a response without damping with the graph of FIG. 4 which shows a response with damping. It has been found that the present invention provides electron emission reduction of more than 98%.

While the invention has been described in one presently preferred embodiment it is understood that the words which have been used are words of description rather than words of limitation and that changes within the purview of the appended claims may be made without departing from the scope and spirit of the invention in its broader aspects.

What is claimed is:

1. A satellite test chamber for simulating system generated electromagnetic pulses comprising
   a spherical chamber,
   means for holding a satellite to be tested at the center of said chamber,
   an X-ray source for generating high power X-ray pulses positioned to direct X-ray pulses generated thereby to the center of said chamber and onto a satellite disposed thereat, said X-ray source and said spherical chamber being integrated to form a hermetically sealed system,
   vacuum means for evacuating said hermetically sealed system, and
   a spherical resistive resonance suppression grid within and concentric with said spherical chamber, said resonance suppression grid being physically spaced from the inner surface of said spherical chamber and electrically isolated therefrom.

2. A satellite test chamber as defined in claim 1 wherein said spherical resistive resonance suppression grid has a radius that effects optimum damping of electromagnetic wave energy at the fundamental chamber standing wave frequency.

3. a satellite test chamber as defined in claim 2 including a coating of electron emission suppression material on the inner surface of said spherical chamber.

4. A satellite test chamber as defined in claim 3 including a spherical resistive electron backscatter suppression grid disposed between said spherical resistive resonance suppression grid and said spherical chamber.

5. A satellite test chamber as defined in claim 4 wherein the grid wires of said resonance suppression grid and said electron backscatter suppression grid are spaced at approximately 0.75 inches and the impedance of each grid is substantially 200 ohms per square.

6. A satellite test chamber as defined in claim 5 wherein said electron backscatter suppression grid and said resonance suppression grid are spaced approximately 0.13 and 0.20 radii respectively from the inner surface of said spherical chamber.

* * * * *